United States Patent [19]
Singer

[11] Patent Number: 5,805,428
[45] Date of Patent: Sep. 8, 1998

[54] TRANSISTOR/RESISTOR PRINTED CIRCUIT BOARD LAYOUT

[75] Inventor: James H. Singer, Houston, Tex.

[73] Assignee: Compaq Computer Corporation, Houston, Tex.

[21] Appl. No.: 771,569

[22] Filed: Dec. 20, 1996

[51] Int. Cl.[6] .............................. H05K 7/02; H05K 7/06
[52] U.S. Cl. ................... 361/777; 361/774; 361/782; 361/783; 174/261; 257/723
[58] Field of Search ........................ 361/760, 763, 361/766, 772, 777, 778, 782, 764, 774, 783; 174/261, 260; 257/723, 724

[56] References Cited

U.S. PATENT DOCUMENTS

| | | | |
|---|---|---|---|
| 3,716,761 | 2/1973 | Rotast ....................................... | 361/777 |
| 4,489,365 | 12/1984 | Daberkoe ................................. | 361/777 |
| 4,613,924 | 9/1986 | Brault ....................................... | 361/774 |
| 5,064,378 | 11/1991 | Olson et al. ............................. | 174/261 |
| 5,266,747 | 11/1993 | Gheorghiu et al. ...................... | 174/261 |
| 5,557,505 | 9/1996 | Silva ......................................... | 361/777 |
| 5,650,665 | 7/1997 | Yamamoto et al. ...................... | 361/777 |
| 5,683,788 | 11/1997 | Dugan et al. ............................ | 361/777 |

*Primary Examiner*—Leo P. Picard
*Assistant Examiner*—John B. Vigushin
*Attorney, Agent, or Firm*—Pravel, Hewitt, Kimball & Krieger

[57] ABSTRACT

An improved printed circuit board layout is provided in which a transistor or a resistor (preferably a zero ohm resistor) can be installed. If a transistor is installed, this allows for selectively passing a signal; if a resistor is installed, the line is directly coupled. The resistor and transistor are surface mount devices, and the two pads for the resistor are overlapped with two of the pads for the source and the drain of the transistor. A separate pad is provided for the gate of the transistor. In this way, alternatively either a resistor or a transistor can be installed, but the trace links, stubs, and resulting undesirable effects are minimized through the overlapping pads.

14 Claims, 4 Drawing Sheets

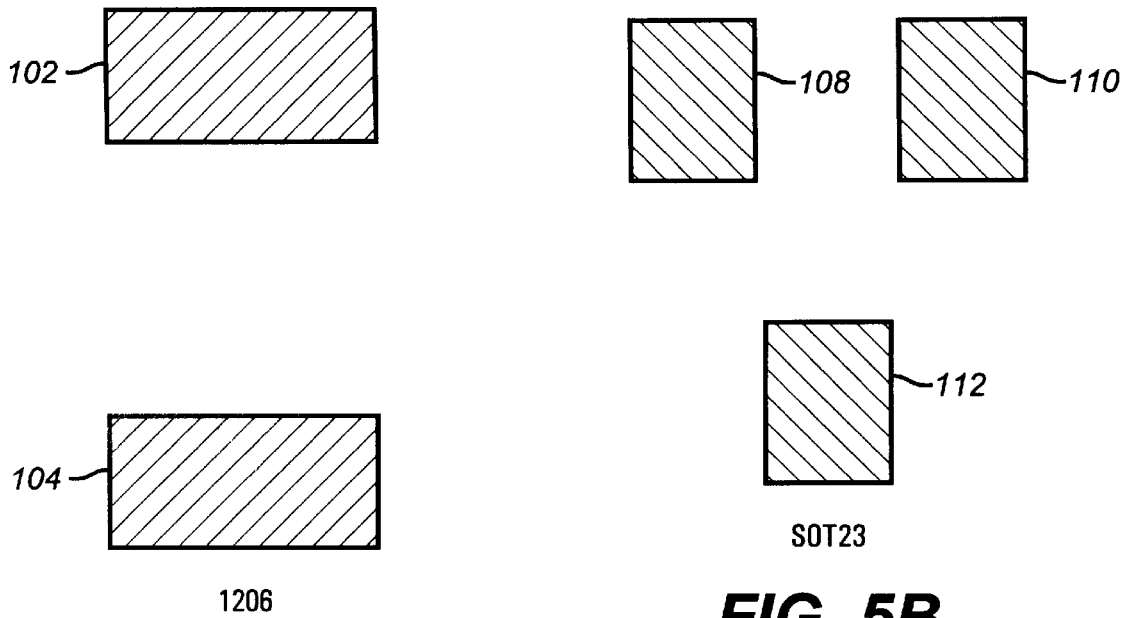
FIG. 5A
FIG. 5B
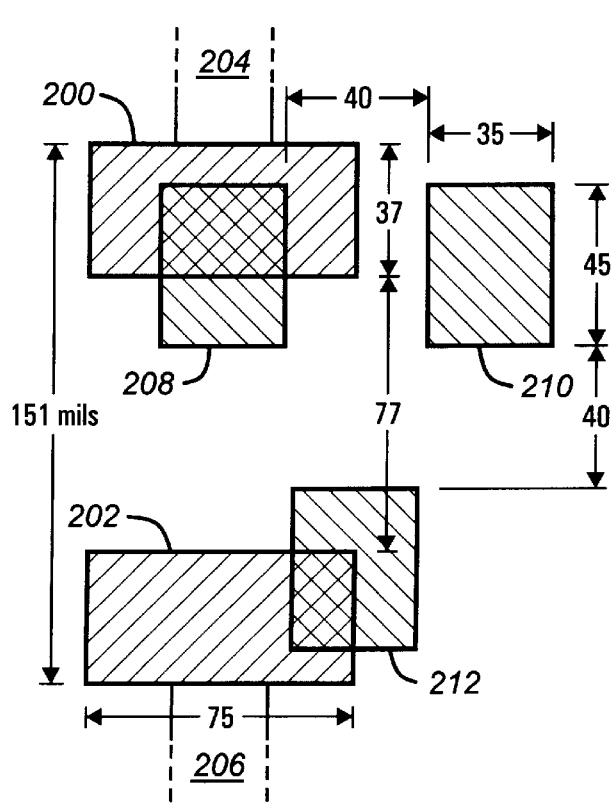
FIG. 6

TRANSISTOR/RESISTOR PRINTED CIRCUIT BOARD LAYOUT

BACKGROUND OF THE INVENTION

1. Field of the Invention

The invention relates to printed circuit board layout configurations and techniques, and more particularly, to an improved geometry for alternatively allowing installation of a resistor or a transistor.

2. Description of the Related Art

The field of electronics has continually pushed towards miniaturization of components and systems. Handheld computers now far exceed the power of the largest computers of twenty years ago, and the trend continues. One of the areas and bases of miniaturization has been in printed circuit board design: through-hole printed circuit boards are becoming rarer, with most components now being affixed using surface mount technology. This provides advantages not only in size, but in efficiency and automation of installation.

While the size of electronic components has decreased, their speed has increased. This advance presents its own unique set of problems. For example, at low frequencies, board and component layout is relatively non-critical. Traces can be long and circuitous, as there are few timing critical paths, and electromagnetic interference is only of minor concern. But with faster components and buses for communicating between those components, this has changed. Timing is becoming a greater concern in both component and printed circuit board design.

Therefore, any techniques that improve timing critical paths on printed circuit boards and reduce electromagnetic interference are greatly desirable.

SUMMARY OF THE INVENTION

A fairly common requirement in printed circuit board design is provision for installation of alternative components. Specifically, it is often desirable to alternatively install a transistor switch or instead a zero ohm resistor. If necessary, the transistor can be installed; otherwise it can be "bypassed" using a zero ohm resistor.

Using standard layout techniques, however, this alternative circuitry results in added traces and stubs that would be absent if a single trace were used rather than the alternative resistor/transistor layout. These trace stubs alter the impedance characteristics and could increase electromagnetic interference of the layout. To reduce this effect, according to the invention, pads are provided on a printed circuit board so that the two pads of a surface mount resistor actually overlap two pads of a surface mount switching transistor instead of being coupled in parallel but at a distance from the transistor. A third pad is then provided for the transistor, preferably to activate the gate of the transistor if installed.

By overlapping the pads, the stub length and overall trace length are reduced compared to that required if the layout were prepared so that the resistor and transistor did not have overlapping footprints.

Then, in assembly, either the resistor or the transistor can be installed, but not both. The footprints are overlapping, preventing both of the components from being installed, but this does not matter because only one or the other would ever be needed.

BRIEF DESCRIPTION OF THE DRAWINGS

A better understanding of the present invention can be obtained when the following detailed description of the preferred embodiment is considered in conjunction with the following drawings, in which:

FIGS. 5A and 5B are diagrams illustrating the pad layouts for transistors and resistors to be used according to the invention;

FIG. 6 is a diagram illustrating the layout of pads for a transistor and resistor in a PCB layout according to the invention;

FIG. 7C is a diagram illustrating the pads of FIG. 7A when used in conjunction with a surface mount resistor according to the invention.

DETAILED DESCRIPTION OF THE PREFERRED EMBODIMENT

Figure 1:
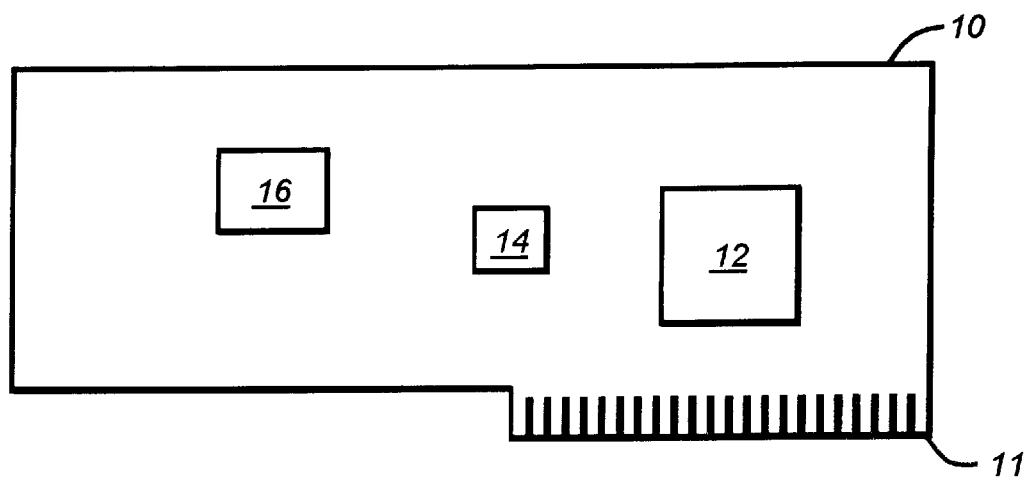
FIG. 1 is a diagram of a printed circuit board (PCB) that would typically be used according to the invention.
Figure 2A:
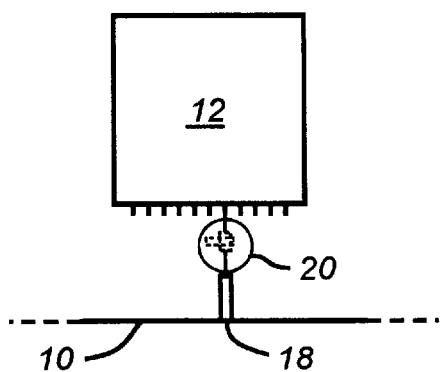
FIGS. 2A and 2B are close up views of the printed circuit board of FIG. 1 illustrating the layout according to the invention.
Figure 2B:
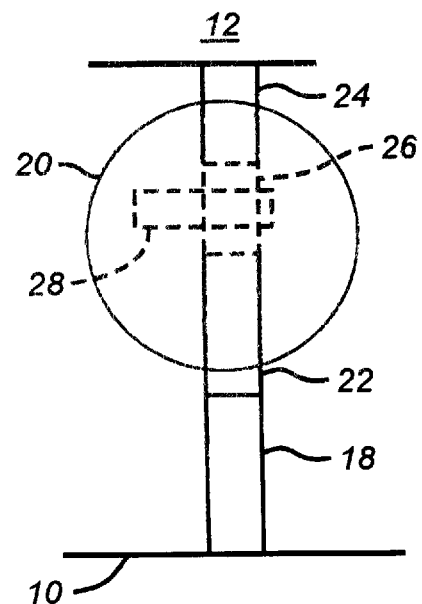

Turning to FIG. 1, shown is a diagram illustrating a standard peripheral component interconnect (PCI) bus printed circuit board 10 having a connector 11. This printed circuit board 10 includes a number of components, including components shown as 12, 14, and 16. The component 12 is further illustrated in FIG. 2A, which shows the component 12 connected to a pin 18 via conductive traces and circuitry 20. The conductive traces and circuitry 20 are further illustrated in FIG. 2B. From the pin 18, a trace 22 extends upwards toward the component 12; from the component 12, a trace 24 extends downward toward the pin 18. The traces 22 and 24 could be a single trace without any intervening circuitry, but according to the invention, the circuitry 20 is included, which alternately provides for installation of a surface mount resistor 26 or a surface mount transistor 28. As can be seen from FIG. 2B, the surface mount resistor 26 has a footprint which overlaps that of the surface mount transistor 28, so the two components cannot be simultaneously installed. This is acceptable, however, because as discussed below in conjunction with FIG. 3, the circuitry either requires a zero ohm resistor or a switching transistor, but not both. It will be appreciated that the conductive traces and circuitry 20 can be repeated for a plurality of the pins on the connector 11.

Figure 3:
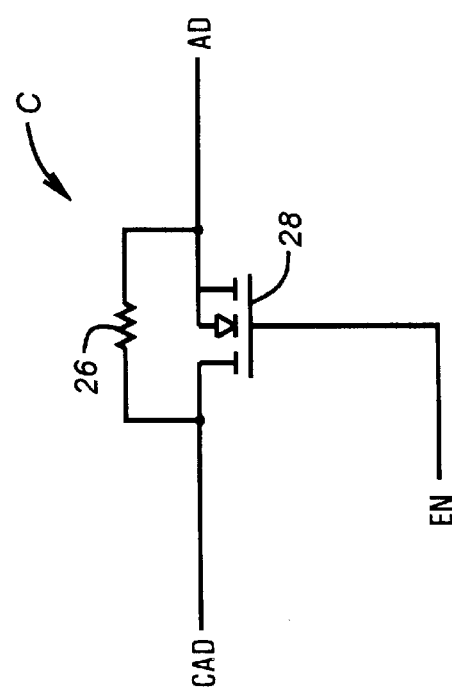
FIG. 3 is a schematic diagram illustrating typical circuitry that would be used with the PCB layout according to the invention.

Turning to FIG. 3, illustrative circuitry C is shown for which the PCB layout according to the invention would be used. The circuit C alternatively provides for the installation of the resistor 26 or the transistor 28. If the resistor 26 is installed, it is preferably simply a short—that is, a zero ohm resistor. If the transistor 28 is installed, it is preferably a switching transistor such as a field effect transistor (FET). One would use a zero ohm resistor, instead of an actual trace, because the resistor 26 can be installed using standard automated surface mount printed circuit assembly and fabrication techniques. When the resistor 26 is installed as a zero ohm resistor, an address signal AD (such as from the pin 18), is directly coupled to a component address signal CAD (such as from the component 12). Alternatively, the transistor 28 is installed. In this case, a source and drain of the transistor 28 couple address and component address lines. The transistor 28 is then switched on and off by an enable signal EN, which is provided to a gate of the transistor 28.

The exact signals chosen are for illustrative purposes only. A variety of situations present themselves where in the design phase it is desirable to either provide a short (or another resistance) or instead install a switching transistor. This could be before testing is completed but when at the same time it is desirable to proceed with manufacture of the board. A wide variety of other situations lead to such a need.

Figure 4:
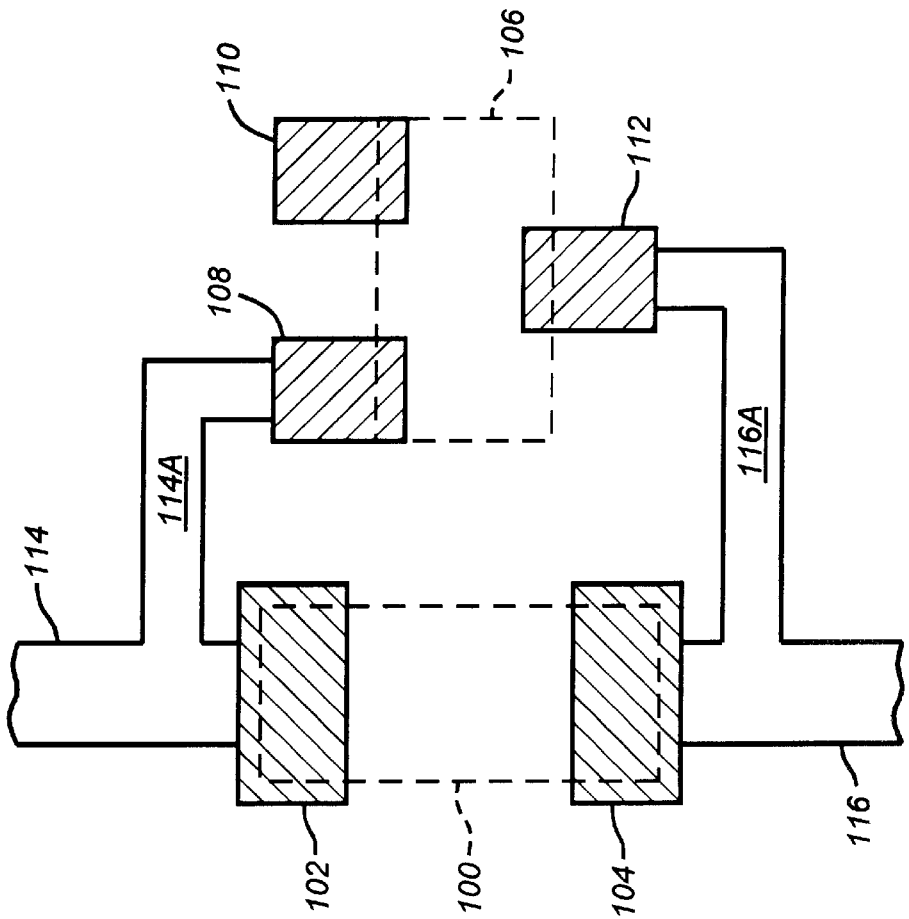
FIG. 4 is a diagram illustrating the PCB layout that would typically be used in prior art implementations.

Referring to FIG. 4, shown is a printed circuit board layout that would typically have been used to alternatively accommodate a zero ohm resistor or a switching transistor. Shown are a footprint of a surface mount zero ohm resistor 100 with two resistor pads 102 and 104. These resistor pads 102 and 104 are conductive pads etched into an insulative printed circuit board. Also shown is a footprint of a surface mount transistor 106, having three pads 108, 110, and 112. The footprints of the illustrated resistor 100 and transistor 106 correspond to a 1206 package surface mount resistor and a SOT23FT or SOT23 package surface mount transistor. These pad configurations are further illustrated below in FIGS. 5A and 5B, which show the pad layout 102 and 104 corresponding to the resistor 100 and the pad layout 108, 110, and 112 corresponding to the transistor 106.

In FIG. 4, assuming the circuitry of FIG. 3 is implemented, it will be appreciated that the pads 108 and 112 correspond to a source and drain of the transistor 28. Thus, either a zero ohm resistor can be installed as the resistor 100, or a switching transistor can be installed in the transistor 106. This results in two alternative methods of coupling two traces 114 and 116—either a short or a switch. Using this layout, however, the trace 114 in conjunction with the pad 102 further includes a stub 114*a* connected to the pad 108, and the trace 116 connected to the pad 104 further includes a trace stub 116*a* connected to the pad 112. These are in effect tiny antennae, and it will be appreciated by those skilled in design that if a high frequency signal is passed through a zero ohm resistor installed in the resistor footprint 100, these stubs could still negatively impact the impedance characteristics, leading to ringing or other undesirable characteristics imparted to the signal.

Turning to FIG. 6, illustrated is a layout according to the invention that eliminates the stubs 114*a* and 116*a*. Shown is a first resistor pad 200 and a second resistor pad 202, which correspond to the pads 102 and 104 of FIG. 4. These are conductive pads coupled to traces 204 and 206, which correspond to the traces 114 and 116. Also shown are three transistor pads 208, 210, and 212, which correspond to the pads 108, 110, and 112 of FIG. 4.

But in the layout of FIG. 6, the resistor pads 200 and 202 overlap two of the transistor pads 208 and 212. The pad 210 is electrically isolated, but provides a connection for the gate of a transistor when a transistor is installed. Also illustrated in FIG. 6 are typical pad dimensions and distances associated with a 1206 resistor and a SOT23 transistor.

It will be appreciated that by using the layout of FIG. 6, the stubs 114*a* and 116*a* are eliminated.

Figure 7A:
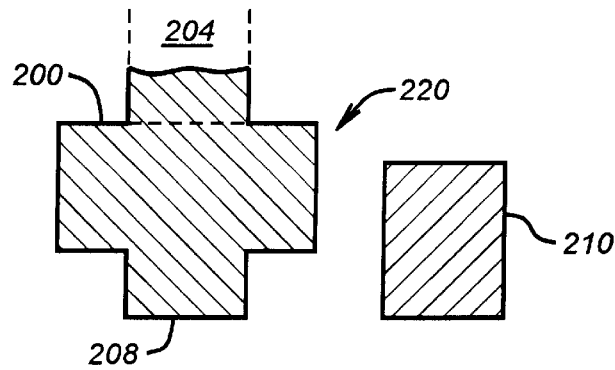
FIG. 7A is a diagram illustrating a typical configuration of conductive pad that would be etched into a printed circuit board for the layout according to the invention.
Figure 7A:
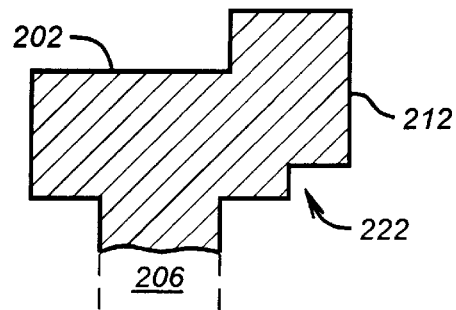
Figure 7B:
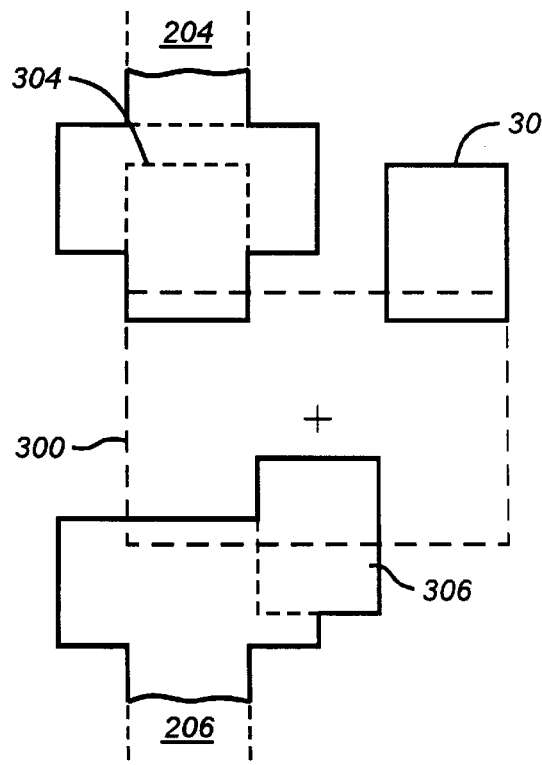
FIG. 7B is a block diagram illustrating the pads of FIG. 7A when used in conjunction with a surface mount transistor according to the invention.
Figure 7B:
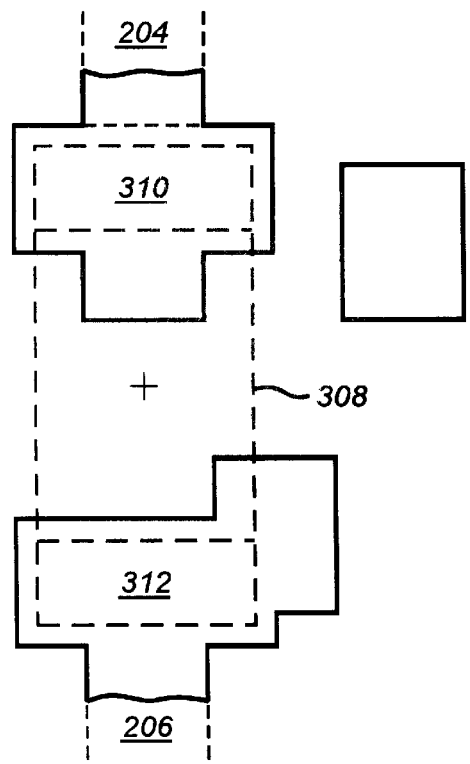

Turning to FIGS. 7A–7C, shown is an implementation of the layout of FIG. 6, where the conductors as they would be laid on the printed circuit board are illustrated. As is seen, the trace 204 connects to a small pad 220 (formed by overlapping pads 200 and 208), which does not have the stub 114*a* and additional pad 108 of FIG. 4. Similarly, in FIG. 6, the trace 206 connects to a small pad 222 (formed by overlapping pads 202 and 212 of FIG. 7A), which again does not have the stub 116*a* and pad 112 of FIG. 4. Instead, as illustrated in FIG. 7B, when a transistor 300 is installed, forming a footprint that includes the body of the transistor 300 and its three pins 302, 304, and 306, a proper connection is made to the conductors 210, 220, and 222. Then, referring to FIG. 7C, if instead a resistor 308 is installed having pins 310 and 312, if that resistor is a zero ohm resistor, a short is properly created between the trace 204 and 206 virtually eliminating any impedance affecting stubs. This results in less signal degradation. It will be appreciated that only the resistor 308 or the transistor 300 can be installed; both cannot be installed because their footprints overlap.

Therefore, according to the invention, an improved printed circuit board layout is provided that reduces negative impedance characteristics and signal degradation from the traces that are necessary to allow the alternative installation of a switching transistor or a resistor. It will be appreciated that a variety of other packages can be used, so long as a portion of the pads of the transistor and the resistor overlap. This technique can be used in a variety of situations where either one or another of a component is necessary in a circuit, but not both.

Finally, it will be appreciated that, in general, layout packages design rules checking must be overridden to allow the creation of this particular pad layout. Generally, layout packages require a minimum distance between various components and between traces. These distances are obviously violated, because the devices actually overlap, because only one would be installed.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A printed circuit board providing pads for alternative installation of a surface mount resistor or a surface mount transistor, the surface mount resistor having a resistor footprint and requiring a first resistor pad and a second resistor pad and the surface mount transistor having a transistor footprint requiring a first transistor pad, a second transistor pad, and a third transistor pad, the printed circuit board comprising:

an insulative printed circuit board substrate;

a conductive layout, the conductive layout including:

the first resistor pad;

the second resistor pad;

the first transistor pad overlapping the first resistor pad;

the second transistor pad overlapping the second resistor pad; and the third transistor pad.

2. The printed circuit board of claim 1, wherein the resistor footprint and the transistor footprint, taken in relation to the resistor pads and transistor pads, overlap such that only the surface mount resistor or the surface mount transistor can be installed, but not both.

3. The printed circuit board of claim 1, wherein the first transistor pad is for a source pin and wherein the second transistor pad is for a drain pin.

4. The printed circuit board of claim 1, wherein the resistor footprint is of a 1206 package resistor and the transistor footprint is of a SOT23 package transistor.

5. The printed circuit board of claim 1 further comprising:
the surface mount transistor installed on the transistor pads.

6. The printed circuit board of claim 5, wherein the transistor footprint of the surface mount transistor is that of a SOT23 package transistor.

7. The printed circuit board of claim 1 further comprising the surface mount resistor installed on the resistor pads.

8. The printed circuit board of claim 7, wherein the resistor footprint of the surface mount resistor is that of a 1206 package resistor.

9. The printed circuit board of claim 7, wherein the surface mount resistor is a zero ohm resistor.

10. The printed circuit board of claim 1, wherein the printed circuit board is a peripheral component interconnect bus printed circuit board, the printed circuit board further comprising:
a peripheral component interconnect bus connector.

11. A conductive layout for a printed circuit board, the conductive layout providing pads for alternative installation of a surface mount resistor or a surface mount transistor, the surface mount resistor having a resistor footprint and requiring a first resistor pad and a second resistor pad and the surface mount transistor having a transistor footprint requiring a first transistor pad, a second transistor pad, and a third transistor pad, the conductive layout comprising:
the first resistor pad;
the second resistor pad;
the first transistor pad overlapping the first resistor pad;
the second transistor pad overlapping the second resistor pad; and
the third transistor pad.

12. A printed circuit board with an improved layout, comprising:
an insulative printed circuit board substrate;
a connector having a plurality of pins;
a first plurality of signal traces connected to pins on the connector;
a second plurality of signal traces carrying signals that should either be directly coupled to the first plurality of signal traces or selectively coupled and decoupled from the first plurality of signal traces; and a plurality of the conductive layouts as recited in claim 11, wherein for each of the plurality of conductive layouts, the first resistor pad is connected to one of the first plurality of signal traces and wherein the second resistor pad is coupled to one of the second plurality of signal traces.

13. The printed circuit board of claim 12, wherein the connector is a peripheral component interconnect connector.

14. A method of providing an improved printed circuit board layout, comprising the steps of:
providing an insulative printed circuit board substrate;
providing a first resistor pad;
providing a second resistor pad;
providing a first transistor pad overlapping the first resistor pad; and
providing a second transistor pad overlapping the second resistor pad.

* * * * *